US012410814B2

United States Patent
Xu (10) Patent No.: US 12,410,814 B2
(45) Date of Patent: Sep. 9, 2025

(54) FAN ASSEMBLY, FAN APPARATUS, AND CONNECTOR

(71) Applicant: PURPLE CLOUD DEVELOPMENT PTE. LTD., Singapore (SG)

(72) Inventor: Shi Man Xu, Hui Zhou (CN)

(73) Assignee: Purple Cloud Development PTE. Ltd., Singapore (SG)

( * ) Notice: Subject to any disclaimer, the term of this patent is extended or adjusted under 35 U.S.C. 154(b) by 0 days.

(21) Appl. No.: 18/079,682

(22) Filed: Dec. 12, 2022

(65) Prior Publication Data

US 2024/0117815 A1    Apr. 11, 2024

(30) Foreign Application Priority Data

Oct. 8, 2022    (CN) .......................... 202211222135.3

(51) Int. Cl.
*F04D 19/00*    (2006.01)
*F04D 25/06*    (2006.01)
(Continued)

(52) U.S. Cl.
CPC ......... *F04D 29/522* (2013.01); *F04D 19/002* (2013.01); *F04D 25/0693* (2013.01); *F04D 29/644* (2013.01); *F04D 25/166* (2013.01); *F04D 29/4226* (2013.01); *F04D 29/424* (2013.01); *F04D 29/646* (2013.01); *F05D 2230/51* (2013.01); *G06F 1/20* (2013.01); *G06F 1/203* (2013.01); *H05K 7/20172* (2013.01)

(58) Field of Classification Search
CPC .. F04D 29/522; F04D 25/0693; F04D 25/166; F04D 19/002; F04D 29/4226; F04D 29/424; F04D 29/646; H05K 7/20172; G06F 1/20; G06F 1/203; F05D 2230/51
See application file for complete search history.

(56) References Cited

U.S. PATENT DOCUMENTS 10,736,232 B1 *   8/2020  Ou ..................... H05K 7/20172
2014/0308121 A1 * 10/2014  Tang ................... F04D 25/0613
                                                      415/220

(Continued)

FOREIGN PATENT DOCUMENTS

CN            216648703 U  *  5/2022

*Primary Examiner* — Nathaniel E Wiehe
*Assistant Examiner* — Art Golik
(74) *Attorney, Agent, or Firm* — MERCHANT & GOULD P.C.

(57) ABSTRACT

A fan assembly includes two fan apparatuses and at least one connector. Each of the two fan apparatuses includes a frame, a fan blade and at least one first terminal. The frame has at least one first engagement recess. The fan blade is rotatably disposed on the frame. The at least one first terminal is located in the at least one first engagement recess. The at least one connector includes a first assembly block and two second terminals. The first assembly block includes two first engaging portions connected to each other. The two second terminals are respectively mounted on the two first engaging portions. The two first engaging portions of the first assembly block are respectively engaged with the at least two first engagement recesses of the two frames, and the two second terminals are respectively plugged and electrically connected to the at least two first terminals.

12 Claims, 5 Drawing Sheets

(51) Int. Cl.
   *F04D 29/52*   (2006.01)
   *F04D 29/64*   (2006.01)
   *F04D 25/16*   (2006.01)
   *F04D 29/42*   (2006.01)
   *G06F 1/20*   (2006.01)
   *H05K 7/20*   (2006.01)

(56) References Cited

U.S. PATENT DOCUMENTS

| | | | | |
|---|---|---|---|---|
| 2017/0331346 | A1* | 11/2017 | Lai | F04D 25/0693 |
| 2020/0208832 | A1* | 7/2020 | Chen | H05K 7/20172 |
| 2021/0018009 | A1* | 1/2021 | Hsieh | F04D 25/0613 |
| 2022/0381253 | A1* | 12/2022 | Chang | F04D 25/166 |
| 2023/0038370 | A1* | 2/2023 | Fang | H05K 7/20172 |

\* cited by examiner

FAN ASSEMBLY, FAN APPARATUS, AND CONNECTOR

CROSS-REFERENCE TO RELATED APPLICATIONS

This non-provisional application claims priority under 35 U.S.C. § 119(a) on Patent Application No(s). 202211222135.3 filed in China, on Oct. 8, 2022, the entire contents of which are hereby incorporated by reference.

TECHNICAL FIELD

The present disclosure relates to a fan assembly, more particularly to a fan assembly integrating the installation and series circuit connection of two fans.

BACKGROUND

With the rapid development of technology, the computing performance of various electronic components has also increased significantly, and a large amount of heat has been generated at the same time. To ensure that the electronic components won't be damaged due to high temperature, it is necessary to install a cooling apparatus on an electronic product to dissipate the excessive heat of the electronic components. A common cooling apparatus is a fan, which drives air to flow through the electronic components and remove heat via the operation of the fan so that the electronic components can operate within a certain operating temperature range. Sometimes the cooling capacity of a single fan may not be sufficient, so two or more fans are usually connected in series to form a fan wall to provide sufficient air volume However, currently, when the plurality of fans are to be connected in series, in addition to fixing the fans via screws or snap-fit elements for a mechanical connection, it is necessary that a plurality of cables are respectively plugged to the fans for a series circuit connection. When the plurality of fans are arranged side by side, the space between the fans is limited, which further increases the difficulty for operators to lock screws or plug cables. Therefore, how to simplify the serial connection procedure of the plurality of fans is one of the problems that developers should address.

SUMMARY

The present disclosure provides a fan assembly capable of simplifying the serial connection procedure of two fans.

One embodiment of the present disclosure provides a fan assembly including two fan apparatuses and at least one connector. Each of the two fan apparatuses includes a frame, a fan blade and at least one first terminal. The frame has at least one first engagement recess. The fan blade is rotatably disposed on the frame. The at least one first terminal is located in the at least one first engagement recess. The at least one connector includes a first assembly block and two second terminals. The first assembly block includes two first engaging portions connected to each other. The two second terminals are respectively mounted on the two first engaging portions. The two first engaging portions of the first assembly block are respectively engaged with the at least two first engagement recesses of the two frames, and the two second terminals are respectively plugged and electrically connected to the at least two first terminals.

Another embodiment of the present disclosure provides a fan apparatus including a frame, a fan blade and at least one first terminal. The frame has at least one first engagement recess. The fan blade is rotatably disposed on the frame. The at least one first terminal is located in the at least one first engagement recess.

Another embodiment of the present disclosure provides a connector configured to connect a plurality of fan apparatuses. The connector includes a first assembly block and two terminals. The first assembly block includes two first engaging portions connected to each other, and the first assembly block has at least one first movement limiting recess. The two terminals is respectively mounted on the two first engaging portions.

According to the fan assembly, fan apparatus and connector as described above, since the connector also includes an engaging portion for a mechanical connection and a terminal for a series circuit connection, the operator can complete the mechanical connection and series circuit connection of the two fan apparatuses at one time via the assembly of the connector and the two fan apparatuses so as to integrate the mechanical connection of the two fans and the series connection of the circuit, thereby simplifying the procedure of connecting the two fans in series.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 1:
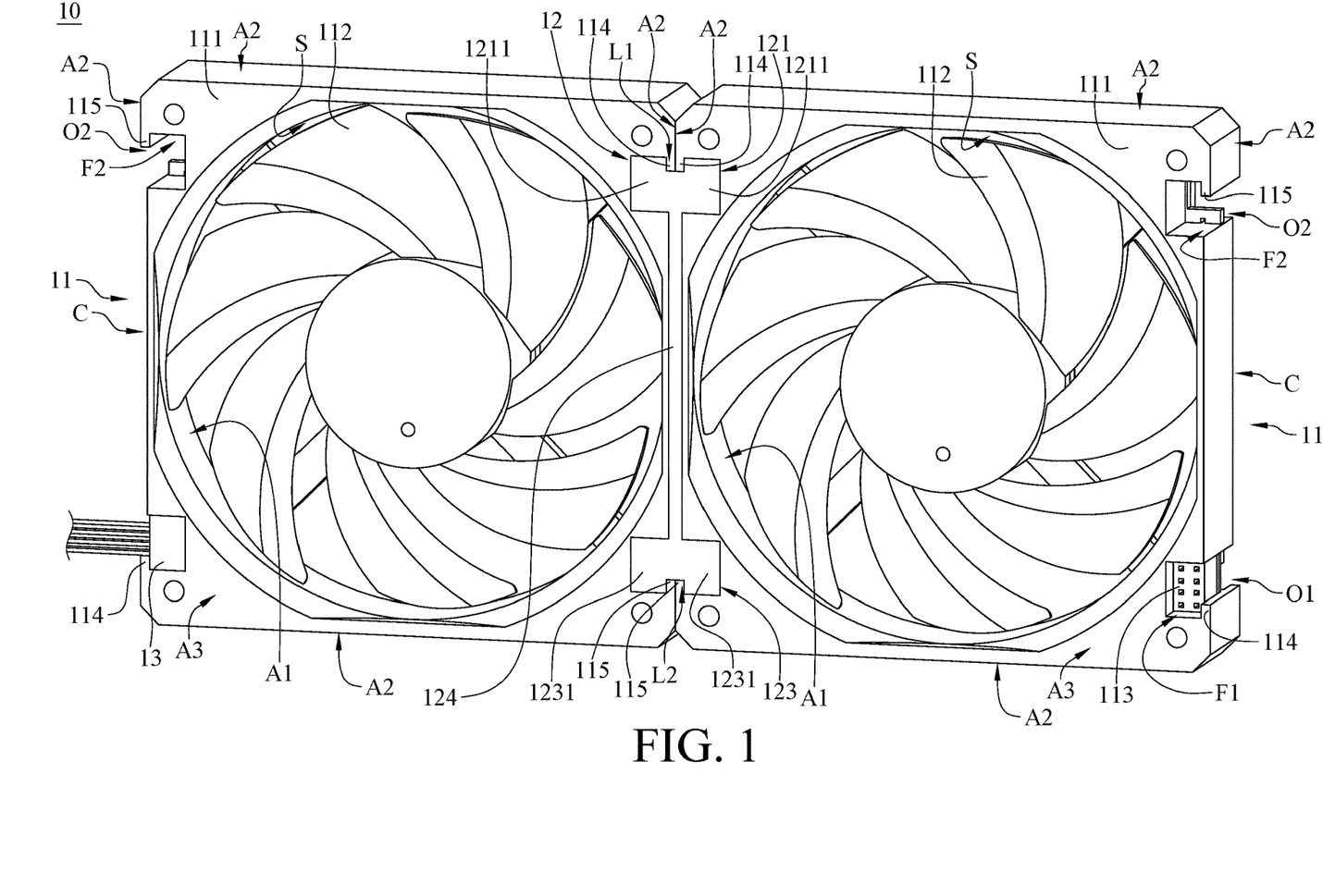
FIG. 1 is a perspective view of a fan assembly in accordance with the first embodiment of the present disclosure.
Figure 2:
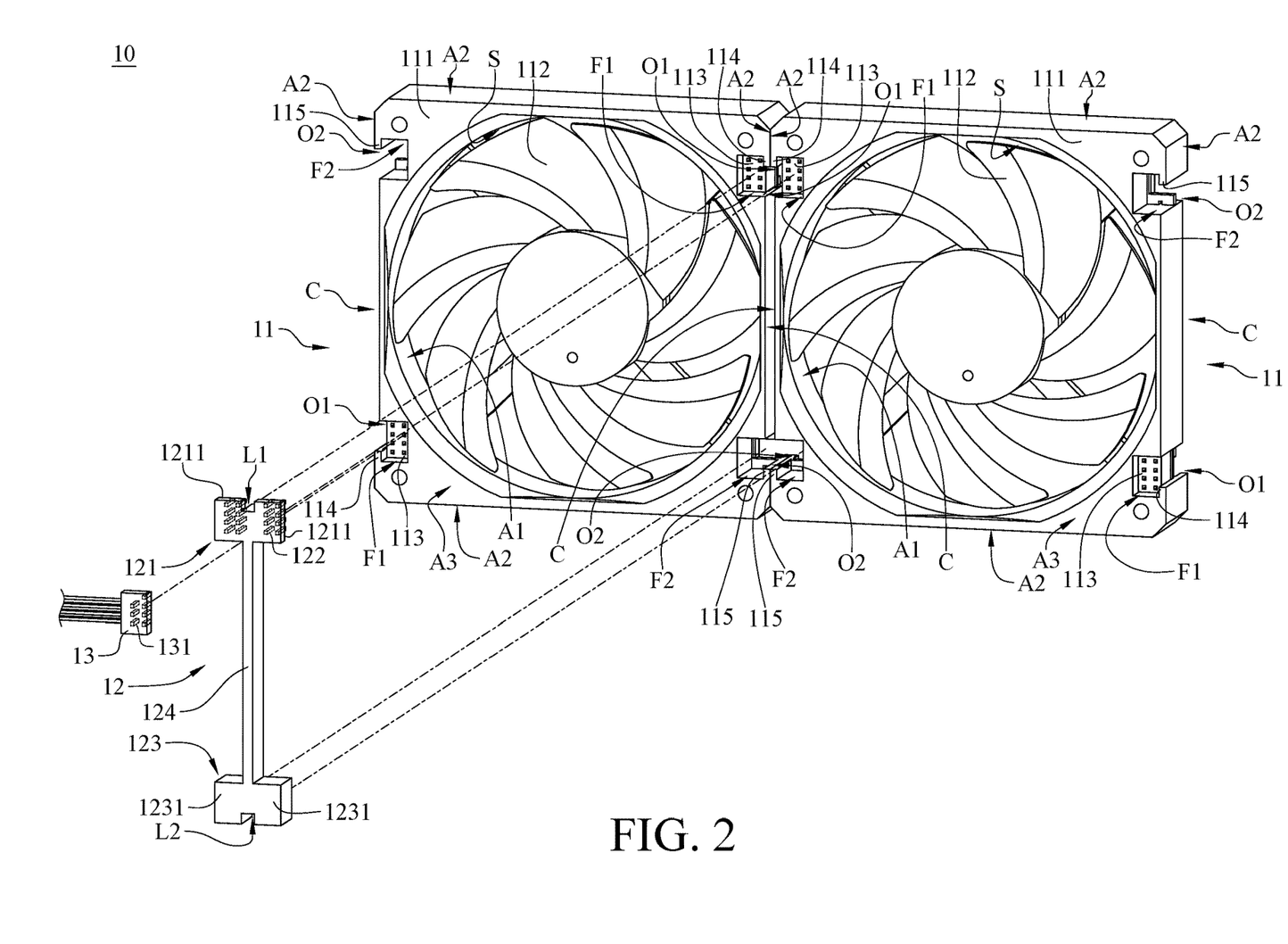
FIG. 2 is a partially exploded view of the fan assembly in FIG. 1.

Referring to FIG. 1 and FIG. 2, FIG. 1 is a perspective view of a fan assembly in accordance with the first embodiment of the present disclosure, and FIG. 2 is a partially exploded view of the fan assembly in FIG. 1.

In this embodiment, a fan assembly 10 is provided. The fan assembly 10 includes two fan apparatuses 11 and a connector 12. Each of the two fan apparatuses 11 includes a frame 111, a fan blade 112, two first terminals 113, and two first protruding portions 114. The frame 111 has an inner annular surface A1, an outer annular surface A2 and an annular front surface A3. The inner annular surface A1 surrounds a fan blade accommodation space S, and the outer annular surface A2 surrounds the fan blade 112 and faces away from the inner annular surface A1. The annular front surface A3 connects with the outer annular surface A2. The frame 111 has two first engagement recesses F1. The two first engagement recesses F1 are recessed inward from the outer annular surface A2 to form two first openings O1. The two first engagement recesses F1 connect with the annular front surface A3. The two first protruding portions 114 are disposed on the frame 111 and cover a part of the two first openings O1. The two first terminals 113 are located in the two first engagement recesses F1. The fan blade 112 is rotatably disposed in the fan blade accommodation space S.

The connector 12 includes a first assembly block 121 and two second terminals 122. The first assembly block 121 includes two first engaging portions 1211 connected to each other. The two second terminals 122 are respectively mounted on the two first engaging portions 1211. The two first engaging portions 1211 of the first assembly block 121 are respectively engaged with the two first engagement recesses F1 of the two frames 111, and the two second terminals 122 are respectively plugged and electrically connected to the two first terminals 113. The first assembly block 121 has a first movement limiting recess L1. The two first protruding portions 114 of the two frames 111 are located in the first movement limiting recess L1 to limit a relative movement of the two fan apparatuses 11. Accordingly, the connector 12 is connected to the two frames 111, and the first movement limiting recess L1 further limits the relative movement of the two fan apparatuses 11. In addition, the connector 12 is electrically connected to the two fan apparatuses 11 via the two first terminals 113 and the two second terminals 122, so the connector 12 is also connected to the circuit of each of the fan apparatuses 11 in the fan assembly 10 in series at the same time. That is, only one of the first terminals 113 is electrically connected to a power supply unit, and the power supply unit can drive all of the fan apparatuses 11 of the fan assembly 10 to operate.

In this embodiment, the quantity of the fan apparatuses 11 of the fan assembly 10 is two, but the present disclosure is not limited thereto. In some other embodiments, the quantity of the fan apparatus of the fan assembly may be more than two.

In this embodiment, the quantity of the connector 12 is one, but the present disclosure is not limited thereto. In some other embodiments, the quantity of the connector may be more than one.

In this embodiment, the quantity of the first terminal 113 of each of the fan apparatuses 11 is two, but the present disclosure is not limited thereto. In some other embodiments, the quantity of the first terminal may be only one.

In this embodiment, the quantity of the first protruding portion 114 of each of the fan apparatuses 11 is two, but the present disclosure is not limited thereto. In some other embodiments, the quantity of the first protruding portion may be only one.

In this embodiment, the two first protruding portion 114 and the frame 111 are formed of a single piece, but the present disclosure is not limited thereto. In some other embodiments, the two first protruding portion may be independent of the frame and disposed on the frame.

In this embodiment, the quantities of the first engagement recess F1 and the first opening O1 of each of the fan apparatuses 11 are two, but the present disclosure is not limited thereto. In some other embodiments, the quantities of the first engagement recess and the first opening may be only one.

In this embodiment, the two first engagement recesses F1 are recessed inward from the outer annular surface A2 to form the two first openings O1, but the present disclosure is not limited thereto. In some other embodiments, the two first engagement recesses may be located between the outer annular surface and the inner annular surface, and the first engagement recesses are separated from the outer annular surface and the inner annular surface.

In this embodiment, the quantity of the first movement limiting recess L1 of the connector 12 is one, but the present disclosure is not limited thereto. In some other embodiments, the quantity of the first movement limiting recess may be more than one.

In this embodiment, the purpose of providing the second terminals 122 in the connector 12 is that in addition to connecting the two fan apparatuses 11 via the engaging portion and the movement limiting recess, the circuit of each of the fan apparatuses 11 is connected in series via an electrical connection between the first terminal 113 of the fan apparatus 11 and the second terminal 122 of the connector 12. Therefore, via the design of providing the terminals respectively on the engaging portions of the connector 12 and the engaging recesses of the fan apparatus 11, the structural assembly and series connection of circuits of two fans can be integrated, thereby simplifying the serial connection procedure of the fans.

In this embodiment, each of the two fan apparatuses 11 further includes two second protruding portions 115. The frame 111 of each of the fan apparatuses 11 further has two second engagement recesses F2 and two accommodation recesses C. The two second engagement recesses F2 and the two first engagement recesses F1 are located on the same side with respect to the fan blade 112. The two second engagement recesses F2 are recessed inward from the outer annular surface A2 to form two second openings O2. The two second protruding portions 115 are disposed on the frame 111 and covers a part of the two second openings O2.

In this embodiment, the connector 12 further includes a second assembly block 123 and a connecting component 124. The connecting component 124 is connected to the first assembly block 121 and the second assembly block 123. The second assembly block 123 includes two second engaging portions 1231 connected to each other. The two second engaging portions 1231 of the second assembly block 123 are respectively engaged with the two second engagement recesses F2 of the two frames 111. The second assembly block 123 has a second movement limiting recess L2. The two second protruding portions 115 of the two frames 111 are located in the second movement limiting recess L2 to limit the relative movement of the two fan apparatuses 11. The two accommodation recesses C are located at the outer annular surface A2 and between the two first engagement recesses F1 and the two second engagement recesses F2 respectively, and the two accommodation recesses C are recessed inward from the outer annular surface A2. The two accommodation recesses C are configured to accommodate the connecting component 124 of the connector 12. Accordingly, the first assembly block 121 and the second assembly block 123 of the connector 12 connect the two frames 111, and the first movement limiting recess L1 and the second movement limiting recess L2 further restrict the relative movement of the two fan apparatuses 11.

In this embodiment, the quantity of the second protruding portion 115 of each of the fan apparatuses 11 is two, but the present disclosure is not limited thereto. In some other embodiments, the quantity of the second protruding portion may be only one.

In this embodiment, the quantities of the second engagement recess F2 and the second opening O2 of each of the fan apparatuses 11 are two, but the present disclosure is not limited thereto. In some other embodiments, the quantities of the second engagement recess and the second opening may be only one.

In this embodiment, the two second engagement recesses F2 are recessed inward from the outer annular surface A2 to form the two second openings O2, but the present disclosure is not limited thereto. In some other embodiments, the two second engagement recesses may be located between the outer annular surface and the inner annular surface, and the second engagement recesses are separated from the outer annular surface and the inner annular surface.

In this embodiment, the quantity of the accommodation recess C of each of the fan apparatuses 11 is two, but the present disclosure is not limited thereto. In some other embodiments, the quantity of the accommodation recess may be only one.

In this embodiment, the quantity of the second movement limiting recess L2 of the connector 12 is one, but the present disclosure is not limited thereto. In some other embodiments, the quantity of the second movement limiting recess may be more than one.

In this embodiment, the fan assembly 10 may further include an external wire 13 and an external terminal 131. The external wire 13 is electrically connected to a power supply unit. The external terminal 131 is disposed on the external wire 13. The external terminal 131 is plugged and electrically connected to one of the first terminals 113. Therefore, the power supply unit can transmit power via the external wire 13 and drive the fan assembly 10 to operate.

Figure 3:
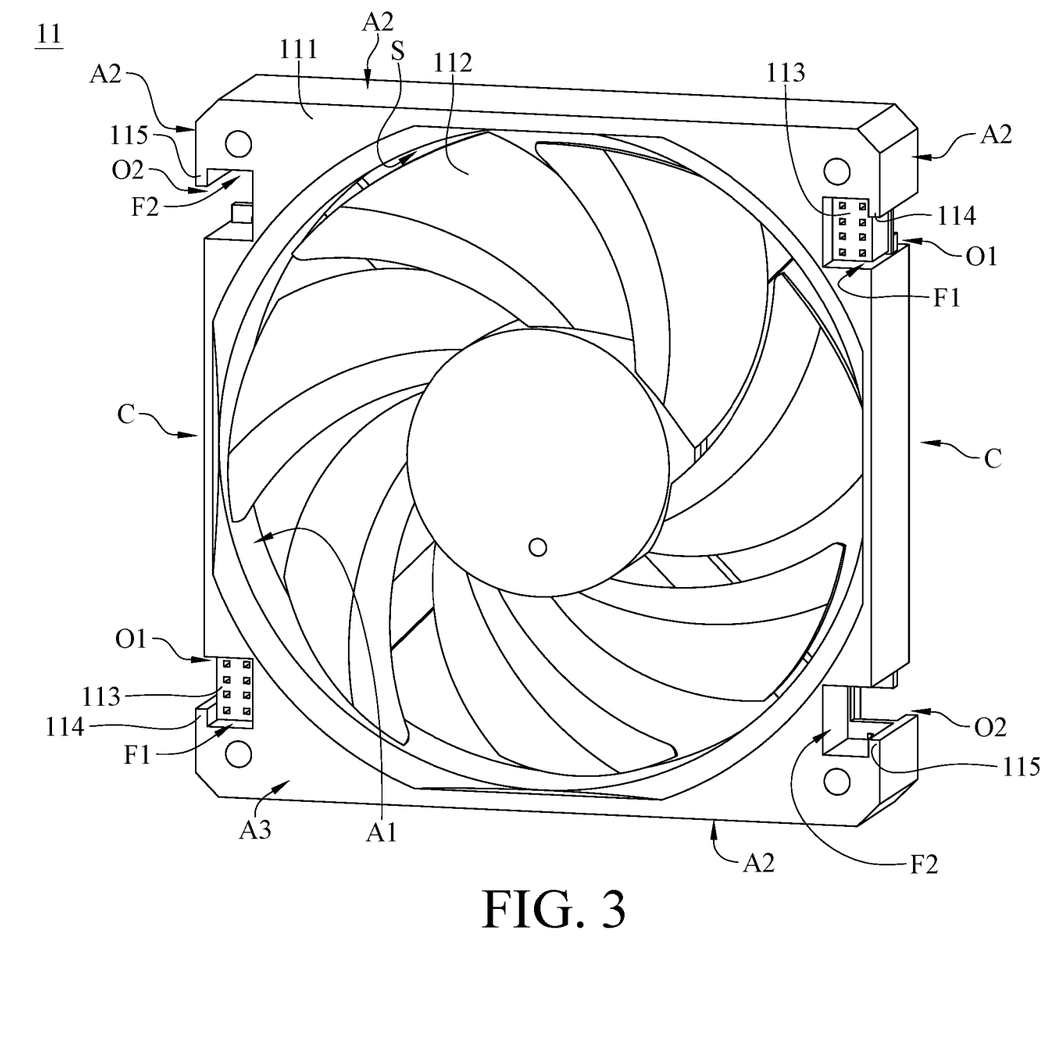
FIG. 3 is a perspective view of a fan apparatus in accordance with the first embodiment of the present disclosure.

Referring to FIG. 3, FIG. 3 is a perspective view of a fan apparatus in accordance with the first embodiment of the present disclosure.

In this embodiment, the fan apparatus 11 includes a frame 111, a fan blade 112, two first terminals 113, and two first protruding portions 114. The frame 111 has an inner annular surface A1, an outer annular surface A2 and an annular front surface A3. The inner annular surface A1 surrounds a fan blade accommodation space S, and the outer annular surface A2 surrounds the fan blade 112 and faces away from the inner annular surface A1. The annular front surface A3 connects with the outer annular surface A2. The frame 111 has two first engagement recesses F1. The two first engagement recesses F1 are recessed inward from the outer annular surface A2 to form two first openings O1. The two first engagement recesses F1 connect with the annular front surface A3. The two first terminals 113 are located in the two first engagement recesses F1. The fan blade is rotatably disposed on the fan blade accommodation space S. Accordingly, the plurality of the fan apparatuses 11 can be engaged with the two first engagement recesses F1 and a connector, and the two first protruding portions 114 can be located in a movement limiting recess of the connector. The movement limiting recess can limit the relative movement of the two adjacent fan apparatuses 11. In addition, the first terminal 113 can be electrically connected to the connector including a terminal, so the connector can be also connected to the circuits of each of the fan apparatuses 11 in series at the same time. That is, only one of the first terminals 113 of the plurality of the fan apparatuses 11 is electrically connected to a power supply unit, and the power supply unit can drive each of the fan apparatuses 11 to operate.

In this embodiment, the quantity of the first terminal 113 is two, but the present disclosure is not limited thereto. In some other embodiments, the quantity of the first terminal may be only one.

In this embodiment, the quantity of the first protruding portion 114 is two, but the present disclosure is not limited thereto. In some other embodiments, the quantity of the first protruding portion may be only one.

In this embodiment, the quantities of the first engagement recess F1 and the first opening O1 are two, but the present disclosure is not limited thereto. In some other embodiments, the quantities of the first engagement recess and the first opening may be only one.

In this embodiment, the two first engagement recesses F1 are recessed inward from the outer annular surface A2 to form the two first openings O1, but the present disclosure is not limited thereto. In some other embodiments, the two first engagement recesses may be located between the outer annular surface and the inner annular surface, and the first engagement recesses are separated from the outer annular surface and the inner annular surface.

In this embodiment, the fan apparatus 11 further includes two second protruding portions 115. The frame 111 of the fan apparatus 11 further has two second movement limiting recesses F2 and two accommodation recesses C. The two second engagement recesses F2 and the two first engagement recesses F1 are located on a same side relative to the fan blade 112. The two second engagement recesses F2 are recessed inward from the outer annular surface A2 to form the two second openings O2. The two second protruding portions 115 are disposed on the frame 111 and covers a part of the two second openings O2. The two accommodation recesses C are located at the outer annular surface A2 and between the two first engagement recesses F1 and the two second engagement recesses F2 respectively, and the two accommodation recesses C are recessed inward from the outer annular surface A2. Accordingly, the plurality of the fan apparatuses 11 can be engaged with a connector via the first engagement recesses F1 and the second engagement recesses F2, and the first protruding portions 114 and the second protruding portions 115 can be respectively located in two movement limiting recesses of the connector. The two movement limiting recesses can limit the relative movement of the two adjacent fan apparatuses 11.

In this embodiment, the quantity of the second protruding portion 115 is two, but the present disclosure is not limited thereto. In some other embodiments, the quantity of the second protruding portion may be only one.

In this embodiment, the quantities of the second engagement recess F2 and the second opening O2 are two, but the present disclosure is not limited thereto. In some other embodiments, the quantities of the second engagement recess and the second opening may be only one.

In this embodiment, the two second engagement recesses F2 are recessed inward from the outer annular surface A2 to form the two second openings O2, but the present disclosure is not limited thereto. In some other embodiments, the two second engagement recesses may be located between the outer annular surface and the inner annular surface, and the second engagement recesses are separated from the outer annular surface and the inner annular surface.

In this embodiment, the quantity of the accommodation recess C is two, but the present disclosure is not limited thereto. In some other embodiments, the quantity of the accommodation recess may be only one.

Figure 4:
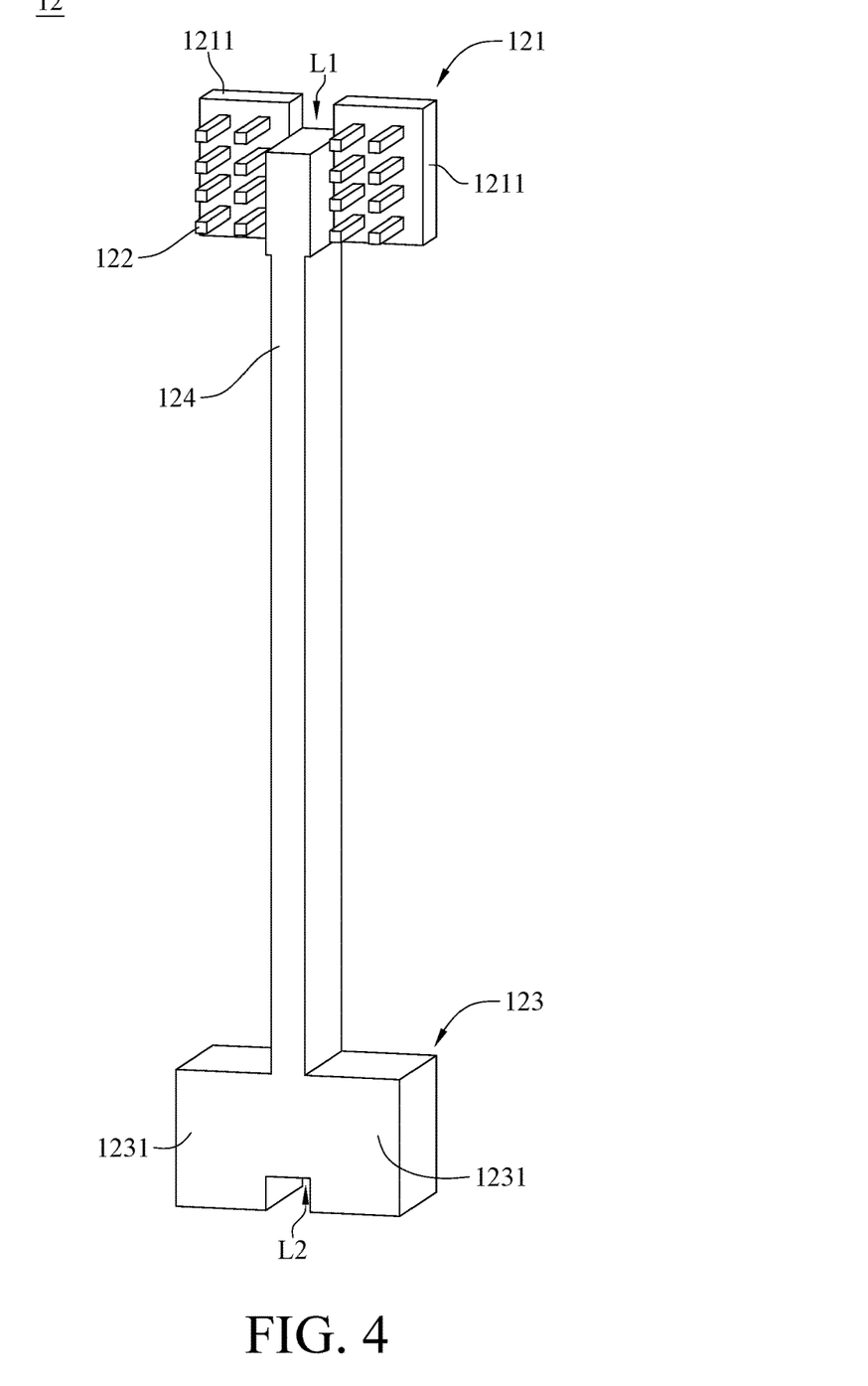
FIG. 4 is a perspective view of a connector in accordance with the first embodiment of the present disclosure.

Referring to FIG. 4, which is a perspective view of a connector in accordance with the first embodiment of the present disclosure.

In this embodiment, a connector 12 includes a first assembly block 121 and two terminals 122. The terminal 122 is the second terminal 122 described in the first embodiment. The first assembly block 121 includes two first engaging portions 1211 connected to each other, and the first assembly block 121 has a first movement limiting recess L1. The two terminals 122 are respectively mounted on the two first engaging portions 1211. Accordingly, the first assembly block 121 of the connector 12 can be connected to the two fan apparatuses, and the first movement limiting recess L1 can engaged with the protruding portions of the two fan apparatuses to further restrict the relative movement of the two fan apparatuses. In addition, the two terminals 122 of the connector 12 can be further electrically connected to the two fan apparatuses so that the power can drive the two fan apparatuses to operate at the same time.

In this embodiment, the quantity of the first movement limiting recess L1 is one, but the present disclosure is not limited thereto. In some other embodiments, the quantity of the first movement limiting recess may be more than one.

In this embodiment, the connector 12 further includes a second assembly block 123 and a connecting component 124. The connecting component 124 is connected to the first assembly block 121 and the second assembly block 123. The second assembly block 123 includes two second engaging portions 1231 connected to each other. The two second engaging portions 1231 of the second assembly block 123 are respectively engaged with the two second engagement recesses F2 of the two frames 111. The second assembly block 123 has a second movement limiting recess L2. Accordingly, the first assembly block 121 and the second assembly block 123 of the connector 12 can be connected to the two fan apparatuses, and the first movement limiting recess L1 and the second movement limiting recess L2 can engaged with the protruding portions of the two fan apparatuses to further restrict the relative movement of the two fan apparatuses.

In this embodiment, the quantity of the second movement limiting recess L2 is one, but the present disclosure is not limited thereto. In some other embodiments, the quantity of the second movement limiting recess may be more than one.

Figure 5:
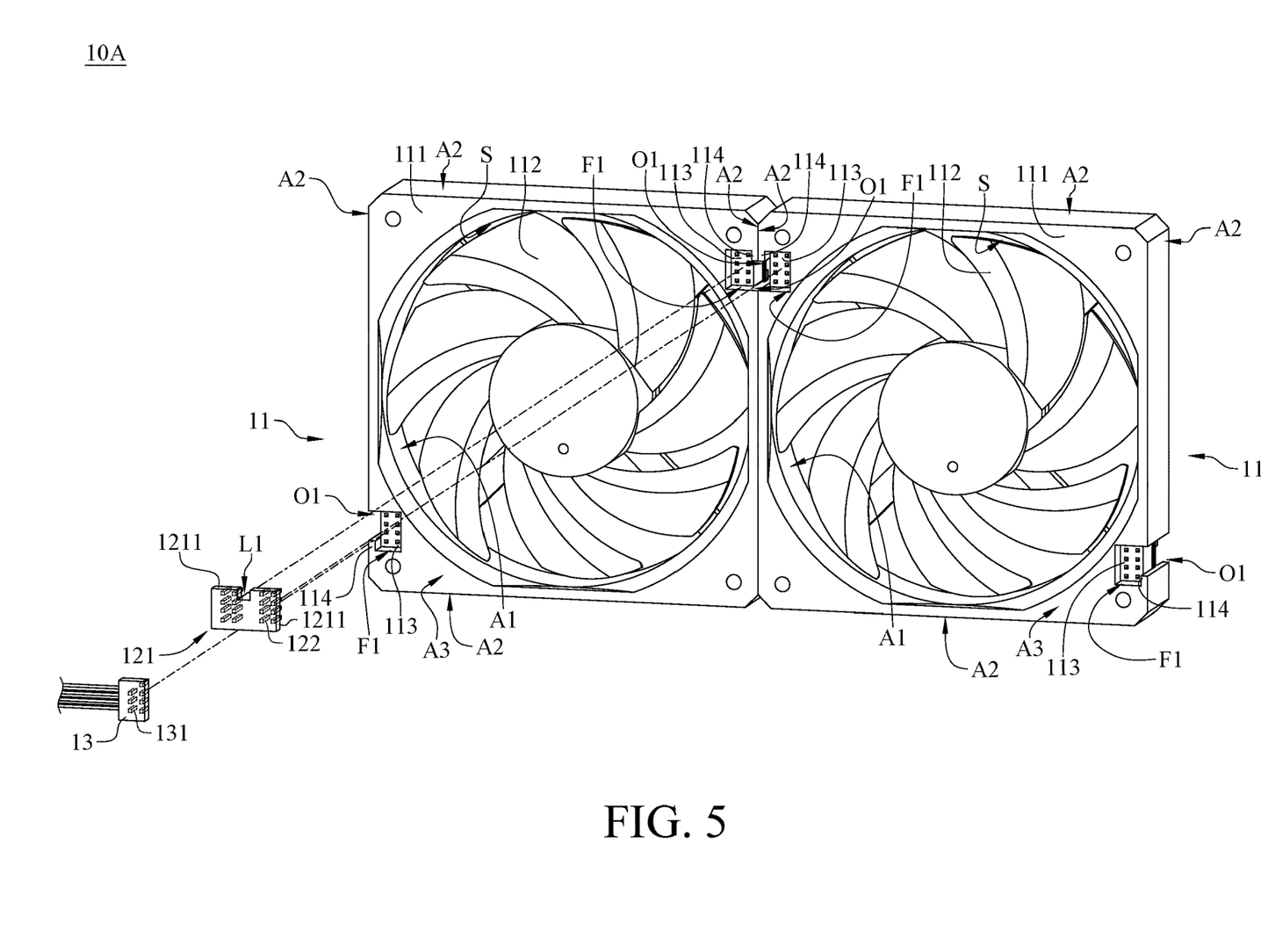
FIG. 5 is a perspective view of a fan assembly in accordance with the second embodiment of the present disclosure.

Referring to FIG. 5, FIG. 5 is a perspective view of a fan assembly in accordance with the second embodiment of the present disclosure.

In this embodiment, a fan assembly 10A is provided. The fan assembly 10A includes two fan apparatuses 11 and a connector 12. Each of the two fan apparatuses 11 includes a frame 111, a fan blade 112, two first terminals 113, and two first protruding portions 114. The frame 111 has an inner annular surface A1, an outer annular surface A2 and an annular front surface A3. The inner annular surface A1 surrounds a fan blade accommodation space S, and the outer annular surface A2 surrounds the fan blade 112 and faces away from the inner annular surface A1. The annular front surface A3 connects with the outer annular surface A2. The frame 111 has two first engagement recesses F1. The two first engagement recesses F1 are recessed inward from the outer annular surface A2 to form two first openings O1. The two first engagement recesses F1 connect with the annular front surface A3. The two first protruding portions 114 are disposed on the frame 111 and covers a part of the two first openings O1. The two first terminals 113 are located in the two first engagement recesses F1. The fan blade is rotatably disposed on the fan blade accommodation space S.

The connector 12 includes a first assembly block 121 and two second terminals 122. The first assembly block 121 includes two first engaging portions 1211 connected to each other. The two second terminals 122 are respectively mounted on the two first engaging portions 1211. The two first engaging portions 1211 of the first assembly block 121 are respectively engaged with the two first engagement recesses F1 of the two frames 111, and the two second terminals 122 are respectively plugged and electrically connected to the two first terminals 113. The first assembly block 121 has a first movement limiting recess L1. The two first protruding portions 114 of the two frames 111 are located in the first movement limiting recess L1 to limit the relative movement of the two fan apparatuses 11. Accordingly, the connector 12 is connected to the two frames 111, and the first movement limiting recess L1 further limits the relative movement of the two fan apparatuses 11. In addition, the connector 12 is electrically connected to the two fan apparatuses 11 via the two first terminals 113 and the two second terminals 122, so the connector 12 is also connected to the circuit of each of the fan apparatuses 11 in the fan assembly 10 in series at the same time. That is, only one of the first terminals 113 is electrically connected to a power supply unit, and the power supply unit can drive each of the fan apparatuses 11 of the fan assembly 10A to operate.

In this embodiment, the quantity of the fan apparatuses 11 of the fan assembly 10A is two, but the present disclosure is not limited thereto. In some other embodiments, the quantity of the fan apparatus of the fan assembly may be more than two.

In this embodiment, the quantity of the connector 12 is one, but the present disclosure is not limited thereto. In some other embodiments, the quantity of the connector may be more than one.

In this embodiment, the quantity of the first terminal 113 of each of the fan apparatuses 11 is two, but the present disclosure is not limited thereto. In some other embodiments, the quantity of the first terminal may be only one.

In this embodiment, the quantity of the first protruding portion 114 of each of the fan apparatuses 11 is two, but the present disclosure is not limited thereto. In some other embodiments, the quantity of the first protruding portion may be only one.

In this embodiment, the two first protruding portion 114 and the frame 111 are formed integrally, but the present disclosure is not limited thereto. In some other embodiments, the two first protruding portion may be independent of the frame and set on the frame.

In this embodiment, the quantities of the first engagement recess F1 and the first opening O1 of each of the fan apparatuses 11 are two, but the present disclosure is not limited thereto. In some other embodiments, the quantities of the first engagement recess and the first opening may be only one.

In this embodiment, the two first engagement recesses F1 are recessed inward from the outer annular surface A2 to form the two first openings O1, but the present disclosure is not limited thereto. In some other embodiments, the two first engagement recesses may be located between the outer annular surface and the inner annular surface, and the first engagement recesses are separated from the outer annular surface and the inner annular surface.

In this embodiment, the quantity of the first movement limiting recess L1 of the connector 12 is one, but the present disclosure is not limited thereto. In some other embodiments, the quantity of the first movement limiting recess may be more than one.

In this embodiment, the purpose of disposing the second terminals 122 in the connector 12 is that in addition to connecting the two fan apparatuses 11 via the engaging portion and the movement limiting recess, the circuit of each of the fan apparatuses 11 is connected in series via an electrical connection between the first terminal 113 of the fan apparatus 11 and the second terminal 122 of the connector 12. Therefore, via the design of disposing the terminals respectively on the engaging portions of the connector 12 and the engaging recesses of the fan apparatus 11, the assembly of two fans and series connection of circuits can be integrated, thereby simplifying the serial connection procedure of the fans.

In this embodiment, the fan assembly 10A may further include an external wire 13 and an external terminal 131. The external wire 13 is electrically connected to a power supply unit. The external terminal 131 is disposed on the external wire 13. The external terminal 131 is plugged and electrically connected to one of the first terminals 113. Therefore, the power supply unit can transmit power via the external wire 13 and drive the fan assembly 10A to operate at the same time.

According to the fan assembly, fan apparatus and connector as described above, since the connector includes an engaging portion for mechanical assembly and a terminal for series circuit connection, the operator can complete the mechanical connection and series circuit connection of the two fan apparatuses at one time via the assembly of the connector and the two fan apparatuses so as to integrate the mechanical connection and the series connection of the circuits of the two fans, thereby simplifying the procedure of connecting the two fans in series.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. A fan assembly, comprising:
two fan apparatuses, each of the two fan apparatuses comprising:
a frame, having at least one first engagement recess;
a fan blade, rotatably disposed on the frame; and
at least one first terminal, wherein each of the respective one of the at least one first terminal is located in a corresponding one of the at least one first engagement recess; and
at least one connector, each of the at least one connector comprising:
a first assembly block, wherein the first assembly block comprises two first engaging portions connected to each other; and
two second terminals, wherein each of the two second terminals is respectively mounted on a corresponding one of the two first engaging portions, each of the two first engaging portions is respectively engaged with a corresponding one of the at least one first engagement recess, and each of the two second terminals are respectively plugged and electrically connected to a corresponding one of the at least one first terminal;
wherein each of the two frames of the two fan apparatuses has an outer annular surface and an annular front surface; in each of the two fan apparatuses, the outer annular surface surrounds the fan blade, the annular front surface connects with the outer annular surface, and the at least one first engagement recess is recessed inward from the outer annular surface to form a first opening and the at least one first engagement recess connects with the annular front surface.

2. The fan assembly according to claim 1, wherein each of the two fan apparatuses further comprises at least one first protruding portion, in each of the two fan apparatuses, each of the at least one first protruding portion is disposed on the frame and covers a part of a corresponding one of the first opening.

3. The fan assembly according to claim 2, wherein first assembly blocks has at least one first movement limiting recess, and each of the at least one first protruding portion is located in a corresponding one of the at least one first movement limiting recess to limit a relative movement of the two fan apparatuses.

4. The fan assembly according to claim 3, wherein each of the two frames of the two fan apparatuses has at least one second engagement recess, in each of the two fan apparatuses, one of the at least one second engagement recess and one of the at least one first engagement recess are located on a same side relative to the fan blade, and the at least one second engagement recess is recessed inward from the outer annular surface to form a second opening; each of the at least one connector further comprises a second assembly block and a connecting component; in each of the at least one connector, the connecting component is connected to the first assembly block and the second assembly block, the second assembly block comprises two second engaging portions connected to each other, and each of the two second engaging portions of the second assembly block are respectively engaged with a corresponding one of the at least one two-second engagement recess recesses of the two frames.

5. The fan assembly according to claim 4, wherein each of the two fan apparatuses further comprises at least one second protruding portion; in each of the two fan apparatuses, the at least one second protruding portion is disposed on the frame and covers a part of the second opening.

6. The fan assembly according to claim 5, wherein the second assembly blocks has at least one second movement limiting recess, and each of the at least one second protruding portion is located in a corresponding one of the at least one second movement limiting recess to limit the relative movement of the two fan apparatuses.

7. The fan assembly according to claim 6, wherein each of the two frames of the two fan apparatuses has at least one accommodation recess; in each of the two fan apparatuses, the at least one accommodation recess is located at the outer annular surface and between the one of the at least one first engagement recess and the one of the at least one second engagement recess that are located on the same side relative to the fan blade, and the at least one accommodation recess is recessed inward from the outer annular surface; each of the at least one accommodation recess of the two frames that are corresponding to each other is configured to accommodate the connecting component of the at least one connector.

8. A fan apparatus, comprising:
a frame, having at least one first engagement recess;
a fan blade, rotatably disposed on the frame; and
at least one first terminal, wherein each of the at least one first terminal is located in a corresponding one of the at least one first engagement recess;

wherein the frame has an outer annular surface and an annular front surface, the outer annular surface surrounds the fan blade, the annular front surface connects with the outer annular surface, and the at least one first engagement recess is recessed inward from the outer annular surface to form a first opening and the at least one first engagement recess connects with the annular front surface.

9. The fan apparatus according to claim 8, wherein the fan apparatus further comprises at least one first protruding portion, and each of the at least one first protruding portion is disposed on the frame and covers a part of the first opening.

10. The fan apparatus according to claim 9, wherein the frame of the fan apparatus has at least one second engagement recess, one of the at least one second engagement recess and one of the at least one first engagement recess are located on a same side relative to the fan blade, and the one of the at least one second engagement recess is recessed inward from the outer annular surface to form a second opening.

11. The fan apparatus according to claim 10, wherein the fan apparatus further comprises at least one second protruding portion, and each of the at least one second protruding portion is disposed on the frame and covers at least a part of the second opening.

12. The fan apparatus according to claim 11, wherein the frame of the fan apparatus has at least one accommodation recess, the at least one accommodation recess is located at the outer annular surface and between the one of the at least one first engagement recess and the one of the at least one second engagement recess that are located on the same side relative to the fan blade, and the one of the at least one accommodation recess is recessed inward from the outer annular surface.

* * * * *